United States Patent [19]
Lo et al.

[11] Patent Number: 5,915,202
[45] Date of Patent: Jun. 22, 1999

[54] BLANKET ETCHING PROCESS FOR FORMATION OF TUNGSTEN PLUGS

[75] Inventors: Chi-Hsin Lo, Ping-Cheng; Dowson Jang, Tsao-Tun; Woei-Ji Song, Taipei, all of Taiwan

[73] Assignee: Taiwan Semiconductor Manufacturing Company, Ltd., Hsin-Chu, Taiwan

[21] Appl. No.: 08/857,161

[22] Filed: May 15, 1997

[51] Int. Cl.⁶ .................................................. H01L 21/461
[52] U.S. Cl. ..................... 438/666; 438/714; 438/720; 438/643
[58] Field of Search ............................ 438/637, 643, 438/648, 714, 720, 666

[56] References Cited

U.S. PATENT DOCUMENTS

| | | | |
|---|---|---|---|
| 5,047,115 | 9/1991 | Charlet et al. . | |
| 5,164,330 | 11/1992 | Daris et al. | 437/192 |
| 5,397,742 | 3/1995 | Kim | 437/190 |
| 5,407,861 | 4/1995 | Marangon et al. | 437/192 |
| 5,521,119 | 5/1996 | Chen et al. . | |
| 5,521,121 | 5/1996 | Tsai et al. . | |
| 5,677,237 | 10/1997 | Tsai et al. . | |

*Primary Examiner*—Caridad Everhart
*Attorney, Agent, or Firm*—George O. Saile; Stephen B. Ackerman

[57] ABSTRACT

An improved and new method of forming tungsten plugs on contact holes in semiconductor integrated circuit devices has been developed. The method uses a two step tungsten etchback process wherein redeposition of etch byproducts is surpressed, residue removal is enhanced, and the overetching requirement is reduced. The result is a more reliable, lower cost, higher yield process.

39 Claims, 1 Drawing Sheet

BLANKET ETCHING PROCESS FOR FORMATION OF TUNGSTEN PLUGS

BACKGROUND OF THE INVENTION (1) Field of the Invention

This invention relates to a method of fabrication used for semiconductor integrated circuit devices, and more specifically to an improved method for forming a tungsten plug on a contact hole.

(2) Description of Related Art

In the manufacture of semiconductor devices, it is necessary to make contact to device regions on the substrate surface through an overlying dielectric layer. This is accomplished by first forming an opening or via hole in the dielectric layer over the region to be contacted, and next filling the opening or via hole with a conductive material. As device geometries have shrunk to submicron dimensions and devices have become more densely packed on the substrate surface, the aspect ratio (ratio of height to width) of the openings or via holes to the device regions has greatly increased. This necessitates the use of CVD (Chemical Vapor Deposition) processes, such as LPCVD (Low Pressure Chemical Vapor Deposition) or PECVD (Plasma Enhanced Chemical Vapor Deposition), to conformally deposit a refractory material, such as tungsten, into high aspect ratio openings or via holes and onto the substrate surface. CVD processes are effective in filling high aspect ratio openings or via holes because in these processes the conductive material growth occurs on both the vertical and horizontal surfaces and, therefore, filling of a narrow-deep contact hole is achieved when the deposited conductive material thickness on a horizontal surface is slightly greater than one/half the contact hole width. Tungsten is commonly used as the via hole filling material because of the ease of deposition of tungsten by CVD processes and the compatibility of tungsten with subsequently deposited aluminum or aluminum alloy interconnection metallization layers. A further improvement to contact technology is the deposition of a barrier and adhesion layer (or multilayer) of titanium and/or titanium nitride into openings or via holes in the dielectric layer and onto the surface of the dielectric layer prior to the deposition of the tungsten. This deposition coats the surface of the semiconductor at the bottom of the openings or via holes formed through the layer of dielectric material, as well as the walls of the openings or via holes formed through the dielectric layer and the surface of the dielectric layer. At the bottom of the via hole, the titanium and/or titanium nitride layer prevents excessive diffusion of the subsequently deposited tungsten into the semiconductor substrate and, also, produces a low contact resistance at the contact through the formation of a low resistance alloy with the silicon substrate at the metal-to-semiconductor interface.

Following CVD deposition of tungsten to fill the contact openings or via holes, a blanket (non-masked) plasma etch process is used to remove the tungsten from the surface of the dielectric layer while leaving plugs of tungsten within the contact openings or via holes. However, numerous problems exist when practicing blanket plasma etching of tungsten. For example, the uniformity of the tungsten etch processes is not ideal and tungsten residue commonly remains on the substrate surface, especially near the substrate edge, after the bulk of the tungsten has been removed from the substrate surface. Overetching in order to remove the tungsten residue causes undesirable etch attack of the tungsten at the contact sites and results in a reduction of the tungsten plug height, thus causing the tungsten plug to be recessed in respect to the top of the contact opening or via hole in the dielectric layer. Such a non-planar surface is difficult to reliably cover with subsequently deposited layers, such as aluminum or aluminum alloy metallization layers. Also, during the blanket etchback of the tungsten layer etching byproducts can redeposit on the substrate surface and result in "micro masking", which also produces undesirable residue. Overetching to remove the "micro masked" residue, also, results in excessive reduction of the tungsten plug height. Redeposition of etching byproducts also affects the manufacturability of the process because buildup of the redeposited byproducts on the processing chamber walls and other surfaces within the plasma etching apparatus increases the possibility of contamination of subsequently processed product. Also, small orifices within the processing chamber can become plugged with redeposited etching byproducts and result in degraded functionality of the plasma etching apparatus. For example, small orifices are used to direct helium onto the backside of substrates during plasma etching in order to produce cooling of the substrate during plasma etching. Helium is effective in this regard due to its high coefficient of thermal conductivity. If the orifices become plugged with redeposited byproduct, the flow of helium is impeded and the temperature of the substrate increases resulting in an undesirable change in etch rate. It is therefore desirable to have a tungsten etchback process which produces minimal etch byproduct redeposition because such a process requires a lower frequency of etching chamber cleaning. Necessity to frequently clean etch chambers adds to product cost because of decreased tool throughput and the added cost of performing the periodic maintenance and disposing of the cleaning waste.

Numerous improvements to the blanket tungsten etchback process have been invented. For example, U.S. Pat. No. 5,407,861 entitled "Metallization Over Tungsten Plugs" granted Apr. 18, 1995 to Maria S. Marangon et al describes a two step blanket etchback method for tungsten plugs in which the first step etches tungsten preferentially with respect to an adhesion layer, such as titanium-titanium nitride, and the second step etches etches tungsten and the adhesion layer at substantially equal rates.

Also, U.S. Pat. No. 5,397,742 entitled "Method for Forming Tungsten Plug for Metal Wiring" granted Mar. 14, 1995 to Choon H. Kim describes a combination of a blanket plasma etchback step and a wet etch step in order to reduce tungsten residues.

U.S. Pat. No. 5,521,121 entitled "Oxygen Plasma Etch Process Post Contact Layer Etch Back" granted May 28, 1996 to Chia S. Tsai et al describes a tungsten plug etchback process followed by an oxygen plasma treatment.

U.S. Pat. No. 5,164,330 entitled "Etchback Process for Tungsten Utilizing a $NF_3$/Ar Chemistry" granted Nov. 17, 1992 to Rickie L. Davis et al describes a three step blanket etchback method utilizing $NF_3$+Ar in the first step, $NF_3$+$Cl_2$+Al in the second step, and $NF_3$+$Cl_2$+Ar in the third step. The object is to reduce residue following the etch process.

While these inventions result in improvements to the blanket tungsten etchback process they do not address critical integrated circuit device manufacturability issues, such as etch byproduct production, overall process yield and process cost.

SUMMARY OF THE INVENTION

One object of the present invention is to provide an improved method of forming tungsten plugs on contact holes in semiconductor integrated circuit devices.

Another object of the present invention is to provide a new and improved method of forming tungsten plugs on contact holes in semiconductor integrated circuit devices, whereby the blanket plasma etch process to remove tungsten results in lower byproduct redeposition, less residue, and less necessity to overetch in order to remove the residue.

A further object of the present invention is to provide a new and improved method or forming tungsten plugs on contact holes in semiconductor integrated circuit devices, whereby the blanket plasma etch process to remove tungsten results in lower byproduct redeposition on the walls of the plasma etch apparatus, thereby reducing the frequency of periodic cleaning of the plasma etch apparatus.

And a further object of the present invention is to provide a new and improved method for etching a tungsten layer during the fabrication of an integrated circuit device on a semiconductor substrate whereby the etching results in lower byproduct redeposition, less residue and less necessity to overetch in order to remove the residue. Also, the improved method for etching tungsten results in lower byproduct redeposition on the walls of the plasma etch apparatus, thereby reducing the frequency of periodic cleaning of the plasma etch apparatus.

In accordance with the present invention, the above and other objectives are realized by using a method for filling openings in a dielectric layer formed on a semiconductor substrate comprising the steps of: providing said substrate having said dielectric layer with said openings; depositing an adhesion layer on said dielectric layer and said underlying regions to substantially cover said dielectric layer and said underlying regions; depositing a refractory metal layer on said adhesion layer to substantially cover said adhesion layer and to substantially fill said openings; plasma etching said refractory metal layer by a method comprising the steps of exposing said substrate to a first rf plasma formed in a first flowing gas mixture of oxygen, argon and $SF_6$; etching said refractory metal layer to endpoint, stopping on said adhesion layer; and exposing said substrate, without interruption of the rf power to form said first rf plasma, to a second rf plasma formed by changing said first flowing gas mixture to a second flowing gas mixture of oxygen and an inert gas, while continuing application of rf power.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of forming tungsten plugs on contact holes in semiconductor integrated circuit devices will now be described in detail.

Figure 1:
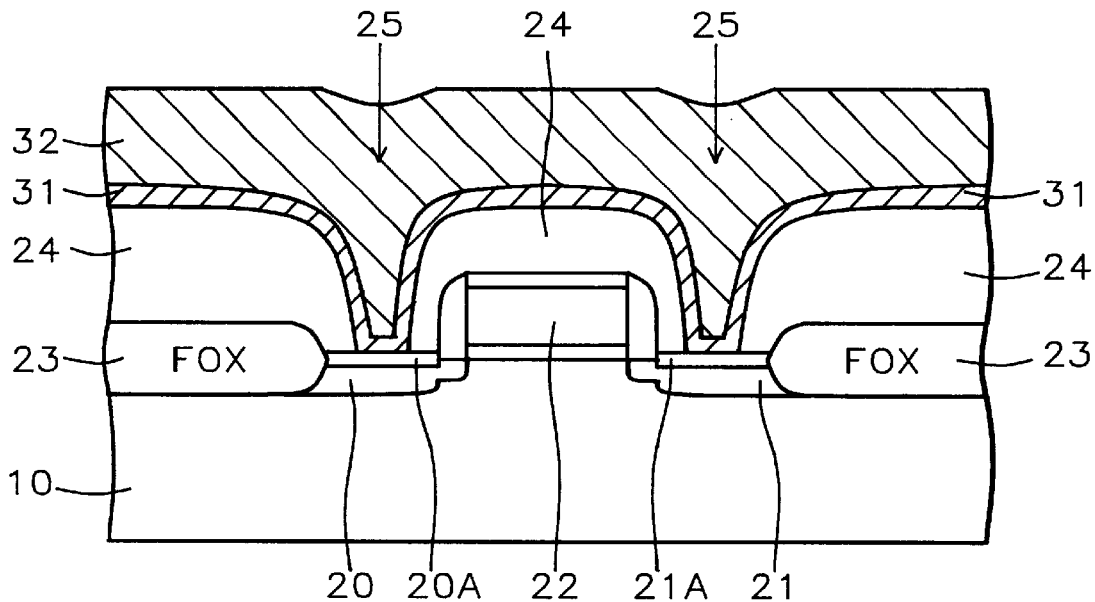
FIG. 1, which schematically, in cross-sectional representation, illustrates a substrate prior to the contact layer etchback.
Figure 2:
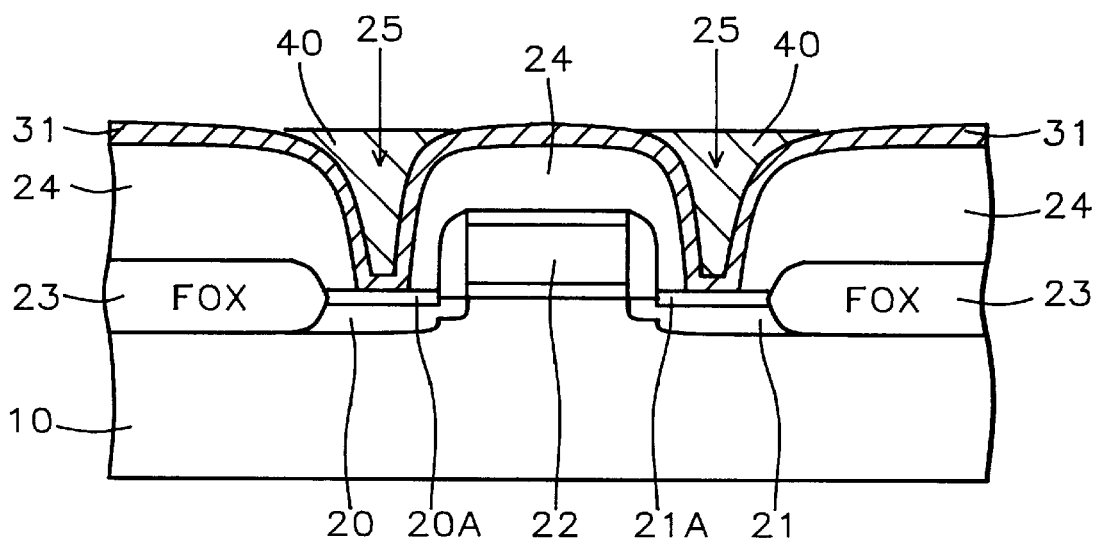
FIG. 2, which schematically in cross-sectional representation, illustrates a substrate after the contact layer etchback.
Figure 3:
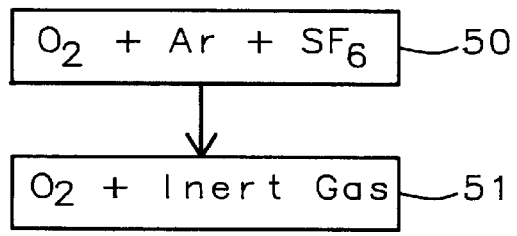
FIG. 3, which is a flow chart of the preferred embodiment of the present invention.

Referring to FIGS. 1–3, an embodiment of the method of the invention is shown starting with FIG. 1 which illustrates schematically, in cross-sectional representation, a portion of a semiconductor substrate 10, upon which the present invention is practiced. The device shown in FIG. 1 is a typical MOS transistor and is shown for representative purposes only. Region 20 is the source, region 21 is the drain, region 22 is the gate and regions 23 are field oxide. Also shown are contact regions 20A and 21A where contact is to be made to the active areas of the device. These contact regions can be formed of a silicide. The structure shown is FIG. 1 is formed using well known prior art semiconductor process techniques. Although a specific MOS transistor is shown, it will be appreciated that the present invention can be practiced on any type semiconductor device or structure.

Also shown in FIG. 1 is a dielectric layer 24 which may be, for example, silicon oxide, silicon nitride, or similar material. The silicon oxide may be deposited by LPCVD (Low Pressure Chemical Vapor Deposition), at a temperature between about 300 to 500° C., to a thickness between about 3000 and 12,000 Angstroms, using $Si-(OC_2H_5)_4$ and $O_2$ at flows between about 100:2000 and 400:600 sccm. Next contact openings 25 are formed in the dielectric layer 24. Subsequently an adhesion layer 31 is formed or the dielectric layer and into the contact openings 25. The adhesion layer 31 may comprise a first layer of titanium having a thickness between about 100 and 500 Angstroms and a second layer of titanium nitride having a thickness between about 500 and 1500 Angstroms. The titanium and titanium nitride layers can be formed by conventional sputter deposition processes.

Afterwards a contact layer 32 is formed on the substrate surface. Contact layer 32 is a refractory metal layer, preferably tungsten, and may be deposited by LPCVD (Low Pressure Chemical Vapor Deposition), at a temperature between about 350 and 500° C., to a thickness between about 3000 and 8000 Angstroms, using $WF_6$ at a flow between about 50 and 1000 sccm.

Referring now to FIG. 2, the contact layer 32 is etched back using a blanket plasma etch process, stopping on the adhesion layer 31. This etchback results in formation of plugs 40 in the contact holes 25. The etchback process is critical and proceeds in two steps, as shown in FIG. 3. The first etchback Step 50 takes place in a first rf plasma formed in a first flowing gas mixture of oxygen, argon and $SF_6$. Typical process parameters for Step 50 are an oxygen flow rate in the range between about 5 and 50 sccm, an argon flow rate in the range between about 50 and 500 sccm, and a $SF_6$ flow rate in the range between about 100 and 1500 sccm. The first rf plasma is formed at a pressure in the range between about 100 and 1000 mTorr and the applied rf power to the first rf plasma is in a range between about 300 and 1500 Watts. Etchback Step 50 proceeds through the tungsten layer 32, stopping on adhesion layer 31. The etchback process then proceeds to the second etchback Step 51 without interruption of the rf power. The second etchback Step 51 takes place in a second rf plasma formed in a second flowing gas mixture of oxygen and an inert gas from the group containing argon, helium and nitrogen. Typical process parameters for Step 51 are an oxygen flow rate in the range between about 5 and 100 sccm and an inert gas flow rate in the range between about 10 and 1000 sccm. The second rf plasma is formed at a pressure in the range between about 10 and 1000 mTorr and the applied rf power to the second rf plasma is in a range between about 100 and 1000 Watts. Step 51 proceeds for a time between about 5 and 50 sec. It is critical that the rf power not be interrupted between Step 50 and Step 51. By sustaining physical bombardment of the substrate surface by inert gas ions the substrate is prevented from cooling. Redeposition of etching byproducts is less likely to occur on higher temperature surfaces. For the same reason it is critical to sustain uninterrupted rf power between Step 50 and Step 51 in order to reduce etch byproduct redeposition on the plasma chamber walls and other plasma etch apparatus features.

While the invention has been particularly shown and described with reference to the preferred embodiments thereof, it will be understood by those skilled in the art that various changes in form and details may be made without departing from the spirit and scope of the invention.

What is claimed is:

1. A method for filling openings in a dielectric layer formed on a semiconductor substrate, said openings exposing a plurality of underlying regions on said substrate, said method comprising the steps of:

providing said substrate having said dielectric layer with said openings;

depositing an adhesion layer on said dielectric layer and said underlying regions to substantially cover said dielectric layer and said underlying regions;

depositing a refractory metal layer on said adhesion layer to substantially cover said adhesion layer and to substantially fill said openings;

plasma etching said refractory metal layer by a method comprising the steps of;

exposing said substrate to a first rf plasma formed in a first flowing gas mixture of oxygen, argon and $SF_6$;

etching said refractory metal layer to endpoint, stopping on said adhesion layer; and exposing said substrate, without interruption of rf power to said first rf plasma, to a second rf plasma formed by changing said first flowing gas mixture to a second flowing gas mixture of oxygen and an inert gas, and continuing applying rf power thereto.

2. The method of claim 1, wherein said dielectric layer is silicon oxide.

3. The method of claim 2, wherein said silicon oxide is deposited by LPCVD, at a temperature between about 300 to 500° C., to a thickness between about 3000 and 12,000 Angstroms, using Si—$(OC_2H_5)_4$ at a flow between about 100 and 400 sccm.

4. The method of claim 1, wherein said adhesion layer comprises a first layer of titanium and a second layer of titanium nitride.

5. The method of claim 4, wherein said first layer of titanium has a thickness between about 100 and 500 Angstroms and said second layer of titanium nitride has a thickness between about 500 and 1500 Angstroms.

6. The method of claim 1, wherein said refractory metal layer is tungsten.

7. The method of claim 6, wherein said tungsten is deposited by LPCVD, at a temperature between about 350 and 500° C., to a thickness between about 3000 and 8000 Angstroms, using $WF_6$ at a flow between about 50 and 1000 sccm.

8. The method of claim 1, wherein said oxygen in said first flowing gas mixture has a flow rate in the range between about 5 and 50 sccm, said argon in said first flowing gas mixture has a flow rate in the range between about 50 and 500 sccm, and said $SF_6$ in said first flowing gas mixture has a flow rate in the range between about 100 and 1500 sccm.

9. The method of claim 1, wherein said first rf plasma is formed at a pressure in the range between about 100 and 1000 mTorr.

10. The method of claim 1, wherein the rf power to said first rf plasma is in a range between about 300 and 1500 Watts.

11. The method of claim 1, wherein said inert gas in said second flowing gas mixture is selected from the group comprising argon, helium and nitrogen.

12. The method of claim 1 wherein said oxygen in said second flowing gas mixture has a flow rate in the range between about 5 and 100 sccm and said inert gas in said second flowing gas mixture has a flow rate in the range between about 10 and 1000 sccm.

13. The method of claim 1, wherein said second rf plasma is formed at a pressure in the range between about 10 and 1000 mTorr.

14. The method of claim 1, wherein the rf power to said second rf plasma is in a range between about 100 and 1000 Watts.

15. The method of claim 1, wherein exposing said substrate to said second rf plasma is for a time between about 5 and 50 sec.

16. A method for etching a refractory metal layer during the fabrication of a device on a semiconductor substrate, said method comprising the steps of:

providing said substrate having said refractory metal layer;

plasma etching said refractory metal layer by a method comprising the steps of;

exposing said substrate to a first rf plasma formed in a first flowing gas mixture of oxygen, argon and $SF_6$;

etching said refractory metal layer to endpoint; and exposing said substrate, without interruption of rf power to said first rf plasma, to a second rf plasma formed by changing said first flowing gas mixture to a second flowing gas mixture of oxygen and an inert gas, and continuing applying rf power thereto.

17. The method of claim 16, wherein said refractory metal layer is tungsten.

18. The method of claim 17, wherein said tungsten is deposited by LPCVD, at a temperature between about 350 and 500° C., to a thickness between about 300 and 800 Angstroms, using $WF_6$ at a flow between about 50 and 1000 sccm.

19. The method of claim 16, wherein said oxygen in said first flowing gas mixture has a flow rate in the range between about 5 and 50 sccm, said argon in said first flowing gas mixture has a flow rate in the range between about 50 and 500 sccm, and said $SF_6$ in said first flowing gas mixture has a flow rate in the range between about 100 and 1500 sccm.

20. The method of claim 16, wherein said first rf plasma is formed at a pressure in the range between about 100 and 1000 mTorr.

21. The method of claim 16, wherein the rf power to said first rf plasma is in a range between about 300 and 1500 Watts.

22. The method of claim 16, wherein said inert gas in said second flowing gas mixture is selected from the group comprising argon, helium and nitrogen.

23. The method of claim 16 wherein said oxygen in said second flowing gas mixture has a flow rate in the range between about 5 and 50 sccm and said inert gas in said second flowing gas mixture has a flow rate in the range between about 10 and 1000 sccm.

24. The method of claim 16, wherein said second rf plasma is formed at a pressure in the range between about to and 1000 mTorr.

25. The method of claim 16, wherein the rf power to said second rf plasma is in a range between about 100 and 1000 Watts.

26. The method of claim 16, wherein exposing said substrate to said second rf plasma is for a time between about 5 and 50 sec.

27. A method for etching a refractory metal layer and stopping on an adhesion layer during the fabrication of a device on a semiconductor substrate, said method comprising the steps of:

provlding said substrate having said refractory metal layer deposited over said adhesion layer;

plasma etching said refractory metal layer by a method comprising the steps of;

exposing said substrate to a first rf plasma formed in a first flowing gas mixture of oxygen, argon and $SF_6$;

etching said refractory metal layer to endpoint; and exposing said substrate, without interruption of rf power to said first rf plasma, to a second rf plasma formed by changing said first flowing gas mixture to a second flowing gas mixture of oxygen and an inert gas, and continuing applying rf power thereto.

28. The method of claim 27, wherein said adhesion layer comprises a first layer of titanium and a second layer of titanium nitride.

29. The method of claim 28, wherein said first layer of titanium has a thickness between about 100 and 500 Angstroms and said second layer of titanium nitride has a thickness between about 500 and 1500 Angstroms.

30. The method of claim 27, wherein said refractory metal layer is tungsten.

31. The method of claim 30, wherein said tungsten is deposited by LPCVD, at a temperature between about 350 and 500° C., to a thickness between about 3000 and 8000 Angstroms, using $WF_6$ at a flow between about 50 and 1000 sccm.

32. The method of claim 27, wherein said oxygen in said first flowing gas mixture has a flow rate in the range between about 5 and 50 sccm, said argon in said first flowing gas fixture has a flow rate in the range between about 50 and 500 sccm, and said $SF_6$ in said first flowing gas mixture has a flow rate in the range between about 100 and 1500 sccm.

33. The method of claim 27, wherein said first rf plasma is formed at a pressure in the range between about 100 and 1000 mTorr.

34. The method of claim 27, wherein the rf power to said first rf plasma is in a range between about 300 and 1500 Watts.

35. The method of claim 27, wherein said inert gas in said second flowing gas mixture is selected from the group comprising argon, helium and nitrogen.

36. The method of claim 27 wherein said oxygen in said second flowing gas mixture has a flow rate in the range between about 5 and 50 sccm and said inert gas in said second flowing gas mixture has a flow rate in the range between about 10 and 1000 sccm.

37. The method of claim 27, wherein said second rf plasma is formed at a pressure in the range between about 10 and 1000 mTorr.

38. The method of claim 27, wherein the rf power to said second rf plasma is in a range between about 100 and 1000 Watts.

39. The method of claim 27, wherein exposing said substrate to said second rf plasma is for a time between about 5 and 50 sec.

* * * * *